(12) United States Patent
Su et al.

(10) Patent No.: US 8,750,043 B2
(45) Date of Patent: Jun. 10, 2014

(54) DATA STORAGE DEVICE AND CONTROL METHOD FOR NON-VOLATILE MEMORY

(75) Inventors: Teng Su, Milpitas, CA (US); Koying Huang, San Jose, CA (US); Johnny Chan, Fremont, CA (US)

(73) Assignee: Winbond Electronics Corp., Taichung (TW)

( * ) Notice: Subject to any disclaimer, the term of this patent is extended or adjusted under 35 U.S.C. 154(b) by 83 days.

(21) Appl. No.: 13/587,158

(22) Filed: Aug. 16, 2012

(65) Prior Publication Data

US 2014/0050041 A1 Feb. 20, 2014

(51) Int. Cl.
*G11C 16/04* (2006.01)
*G11C 16/08* (2006.01)
*G11C 16/10* (2006.01)

(52) U.S. Cl.
CPC .............. *G11C 16/08* (2013.01); *G11C 16/10* (2013.01); *G11C 16/102* (2013.01)
USPC ............ 365/185.11; 365/185.23; 365/185.29

(58) Field of Classification Search
CPC ...... G11C 16/08; G11C 16/10; G11C 16/102; G11C 29/765
USPC ............ 365/185.11, 185.12, 185.29, 185.22, 365/185.23
See application file for complete search history.

(56) References Cited

U.S. PATENT DOCUMENTS

| | | | | |
|---|---|---|---|---|
| 5,838,614 | A * | 11/1998 | Estakhri et al. | 365/185.11 |
| 5,896,393 | A * | 4/1999 | Yard et al. | 714/710 |
| 5,930,815 | A * | 7/1999 | Estakhri et al. | 711/103 |
| 6,076,137 | A * | 6/2000 | Asnaashari | 711/103 |
| 6,122,195 | A * | 9/2000 | Estakhri et al. | 365/185.11 |

* cited by examiner

*Primary Examiner* — Gene Auduong
(74) *Attorney, Agent, or Firm* — Muncy, Geissler, Olds & Lowe, P.C.

(57) ABSTRACT

A data storage device having a non-volatile memory and a controller and a control method for the non-volatile memory are disclosed. The non-volatile memory has a plurality of blocks for data storage and each block provides a plurality of sectors. The controller allocates erase marker bits in each of the sectors to record the progress of an erase operation performed on the non-volatile memory for resumption of the erase operation when required.

14 Claims, 4 Drawing Sheets

DATA STORAGE DEVICE AND CONTROL METHOD FOR NON-VOLATILE MEMORY

BACKGROUND OF THE INVENTION

1. Field of the Invention

The present invention relates to a data storage device and a control method for a non-volatile memory, and particularly relates to resumption of an interrupted erase operation of a non-volatile memory.

2. Description of the Related Art

Non-volatile memories are commonly used in implementing data storage devices. Examples of non-volatile memories include a read-only memory, flash memory, EEPROM, embedded flash, Ferro/magnetic memory, phase change memory, resistive memory, and Nitride storage memory and so on. A non-volatile memory generally requires erase operations to release free space for data storage. However, once an unexpected interrupt (e.g. power loss) occurs during an erase operation, the memory cells which are being erased are left in unknown states and abnormalities occur.

BRIEF SUMMARY OF THE INVENTION

Data storage devices and control methods for non-volatile memories are disclosed.

A data storage device in accordance with an exemplary embodiment of the invention comprises a non-volatile memory and a controller. The non-volatile memory comprises a plurality of blocks for data storage and each block provides a plurality of sectors. The controller allocates erase marker bits in each of the sectors to record the progress of an erase operation performed on the non-volatile memory for resumption of the erase operation when required.

In another exemplary embodiment, a control method for a non-volatile memory is disclosed. The non-volatile memory has a plurality of blocks for data storage and each block provides a plurality of sectors. The control method comprises the following steps: allocating erase marker bits in each of the sectors; and using the erase marker bits to record the progress of an erase operation performed on the non-volatile memory for resumption of the erase operation when required.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
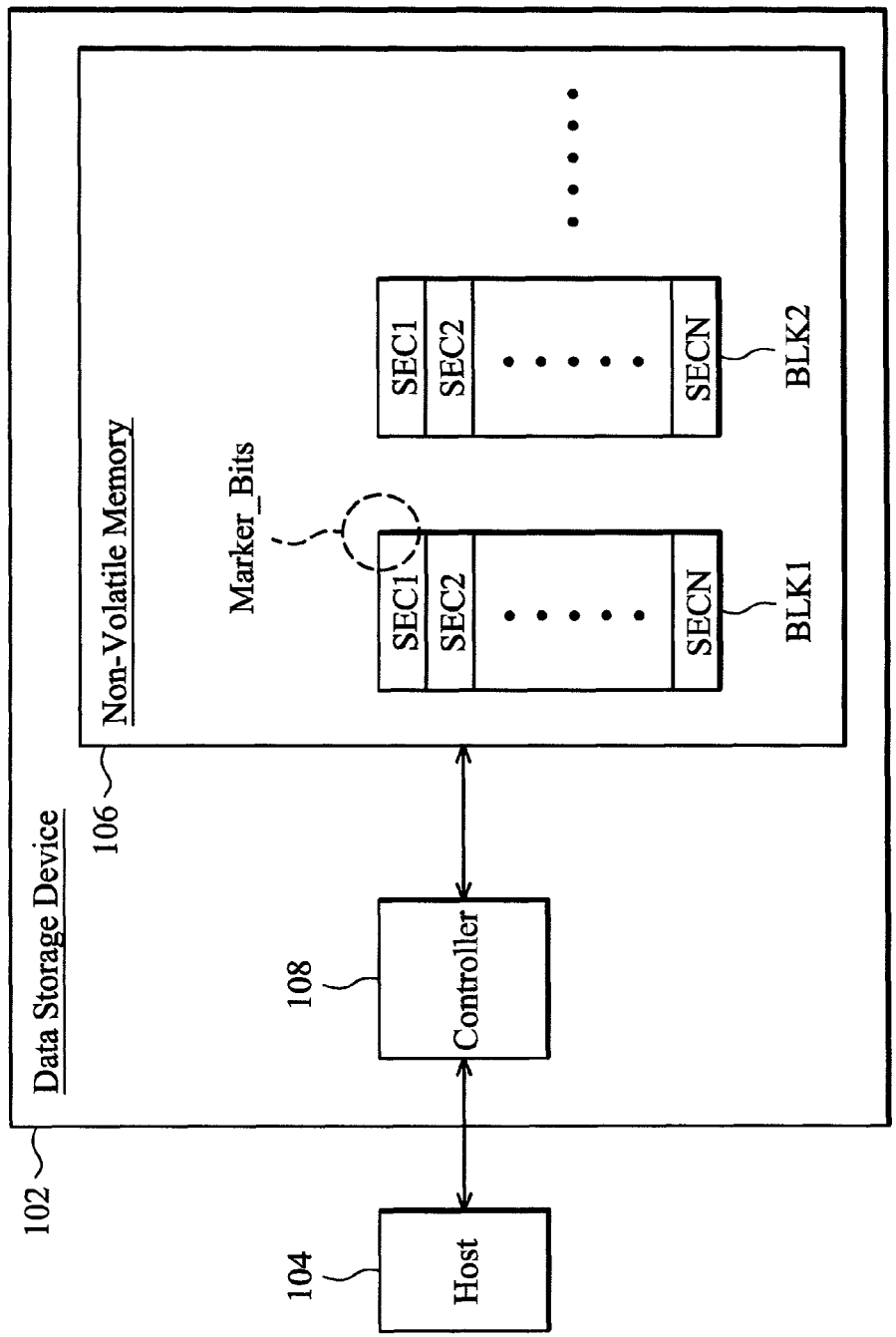
FIG. 1 is a block diagram depicting a data storage device in accordance with an exemplary embodiment of the invention.

FIG. 1 is a block diagram depicting a data storage device 102 in accordance with an exemplary embodiment of the invention. The data storage device 102 may be connected to a host 104 for the task of secondary storage or long-term persistent storage. A user may control the data storage device 102 through an interface between the host 104 and the data storage device 102. In another exemplary embodiment, the data storage device 102 may be implemented in a portable device such as an MP3 or a smart phone and so on; in such an embodiment, the host 104 may be a microcontroller of the portable device.

The data storage device 102 has a non-volatile memory 106 and a controller 108. The controller 108 may further contain a ROM stored with a firmware code. The controller 108 may execute the firmware code to control the non-volatile memory 106 in accordance with instructions from the host 104.

As shown, the non-volatile memory 106 may comprise a plurality of blocks, BLK1, BLK2 and so on, for data storage. Each block provides a plurality of sectors (e.g. sectors of space); for example, block BLK1 comprises a plurality of sectors SEC1, SEC2 to SECN. Under the control of the controller 108, erase marker bits are allocated in each of the sectors (e.g., the last several bits of the sector SEC1 are used as the erase marker bits corresponding to the sector SEC1 and are labeled Marker_Bits). Each sector provides a space for the erase marker bits corresponding thereto and the erase marker bits are not limited to the last several bits of a sector. For example, in other exemplary embodiments, the beginning bits of a sector may be used as the erase marker bits. The controller 108 may record the progress of an erase operation (a sector or a block erase operation) in the erase marker bits of the erased sector or the sectors of the erased block. In accordance with the erase marker bits, the controller 108 may resume the erase operation at the point where the erase operation was unexpectedly interrupted.

For the non-volatile memory 106, the erase operations performed thereon may be a sector erase operation or a block erase operation. For a sector erase operation, only one sector is erased. For a block erase operation, an entire block is erased. To roughly classify the erase type (sector or block), the controller 108 is specially designed. When performing a sector erase operation on one sector, the controller 108 changes the erase marker bits of the one sector. When a block erase operation is performed on one block, the controller 108 changes the erase marker bits of at least two sectors of the one block. In a case wherein a sector/block erase operation was unexpectedly interrupted (for example, interrupted by power loss,) the controller 108 may resume the interrupted erase operation according to the changed erase maker bits. During an erase operation resumption process, the controller 108 may resume a block erase operation on a block under verification when detecting more than one sector of the block under verification containing changed erase marker bits. When determining that the block under verification only has one sector containing changed erase marker bits, the controller 108 may resume a sector erase operation on the one sector within the block under verification. During the erase operation resumption process, the controller 108 verifies the blocks of the non-volatile memory 106 one by one till changed erase marker bits are detected or all blocks of the non-volatile memory 106 are verified.

Figure 2A:
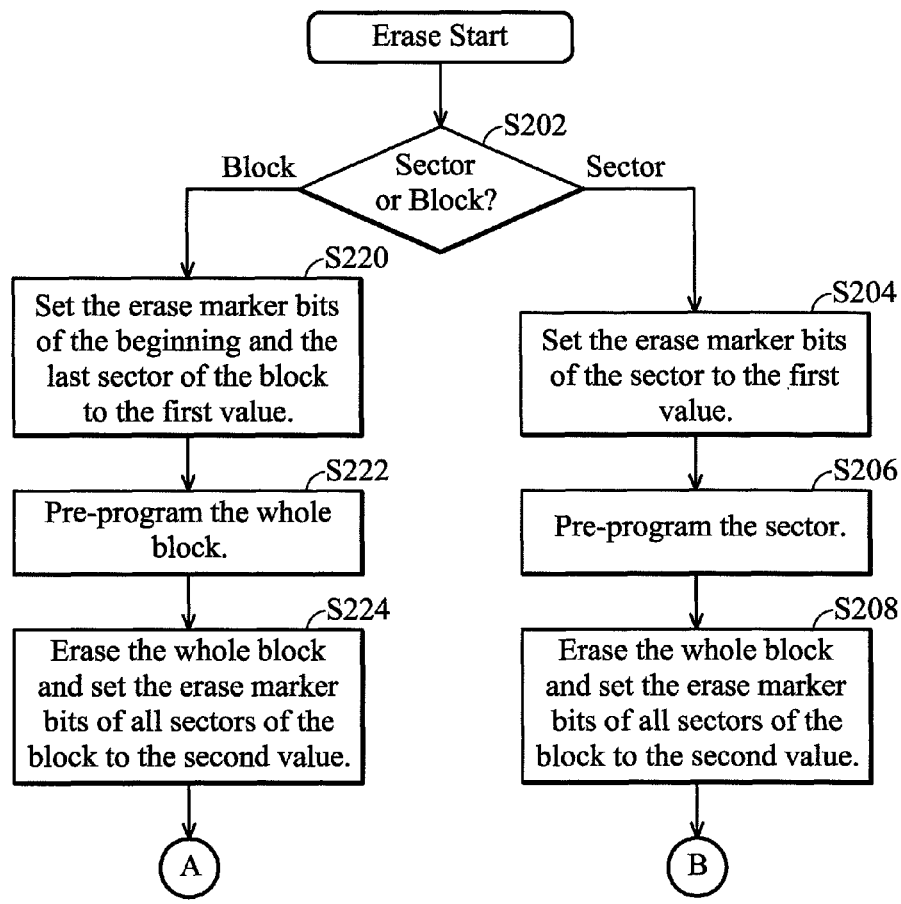
FIG. 2A and FIG. 2B show a flowchart depicting how the controller 108 executes a sector/block erase operation.
Figure 2B:
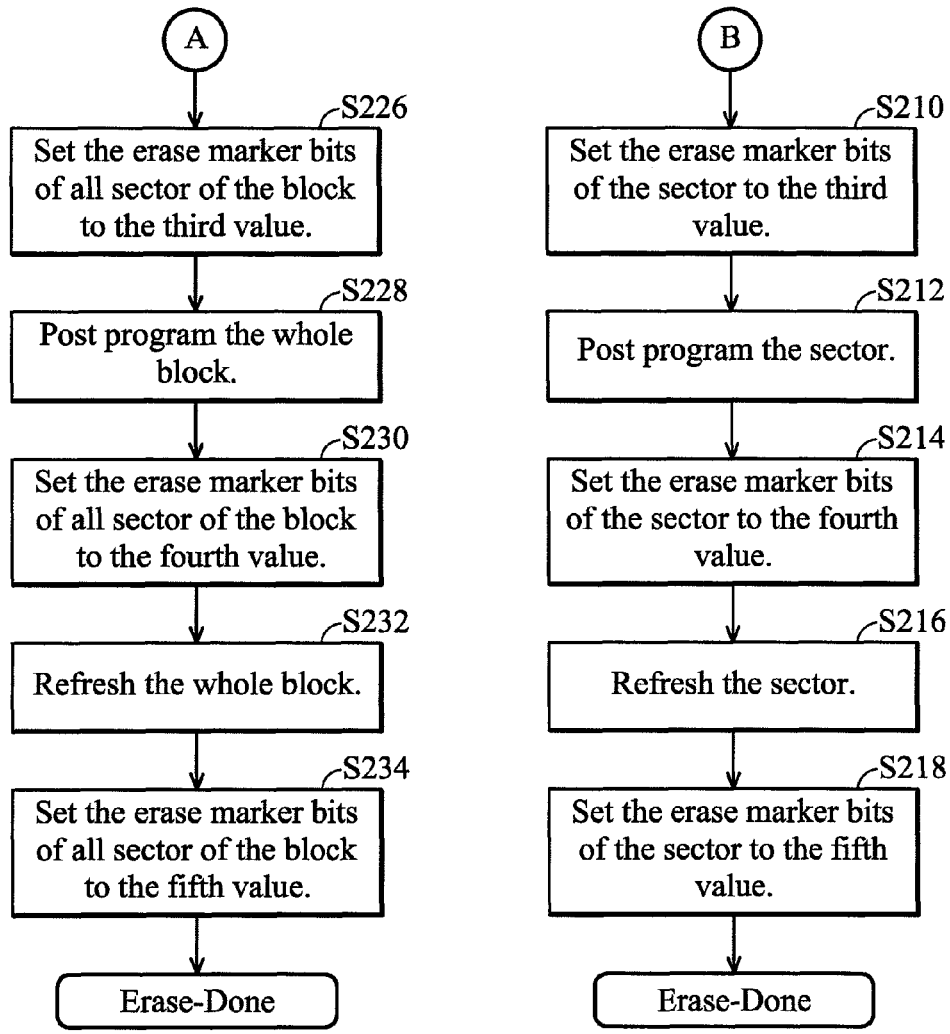

FIG. 2A and FIG. 2B show a flowchart depicting how the controller 108 executes a sector/block erase operation. Note that a sector/block erase operation may be completed by a pre-program process, an erase process, a post program process and a refresh process. The controller 108 may use different values to set the erase marker bits to indicate the different processes. In one exemplary embodiment, erase marker bits of each sector may include 8 bits and the following five different values are provided to set the erase marker bits: a first value (e.g. 8'h00) indicates a pre-program status; a second value (e.g. 8'hFF) indicates an erase status; a third value (e.g. 8'hFC) indicates a post program status; a fourth value (e.g. 8'hF0) indicates a refresh status; and a fifth value (e.g. 8'hC0) is a default value, indicating an erase-done status.

Referring to the flowchart of FIG. 2A and FIG. 2B, the type (sector or block) of the erase operation is recognized in step S202.

When it is determined in step S202 that a sector erase operation is to be performed on a specific sector, steps S204 to S218 are performed. In step S204, erase marker bits of the specific sector are set to the first value (e.g. 8'h00) and, in step S206, the specific sector is pre-programmed. In step S208, the erase process of the sector erase operation is performed on the specific sector and the erase marker bits of the specific sector are set to the second value (e.g. 8'hFF). In step S210, the erase marker bits of the specific sector are set to the third value (e.g. 8'hFC) and, in step S212, the specific sector is post programmed. In step S214, the erase marker bits of the specific sector are set to the fourth value (e.g. 8'hF0) and, in step S216, the specific sector is refreshed. In step S218, the erase marker bits of the specific sector are set to the fifth value (e.g. 8'hC0), which is the default value indicating that the sector erase operation is completed.

When it is determined in step S202 that a block erase operation is to be performed on a specific block, steps S220 to S234 are performed. In step S220, erase marker bits of the beginning sector and the last sector of the specific block both are set to the first value (e.g. 8'h00) and, in step S222, the specific block is pre-programmed in whole. In step S224, the erase process of the block erase operation is performed on the specific block and the erase marker bits of all sectors of the specific block are all set to the second value (e.g. 8'hFF). In step S226, the erase marker bits of all sectors of the specific block are all set to the third value (e.g. 8'hFC) and, in step S228, the specific block is post programmed. In step S230, the erase marker bits of all sectors of the one block are all set to the fourth value (e.g. 8'hF0) and, in step S232, the specific block is refreshed. In step S234, the erase marker bits of all sectors of the specific block are all set to the fifth value (e.g. 8'hC0), which is the default value indicating that the block erase operation is completed.

Figure 3:
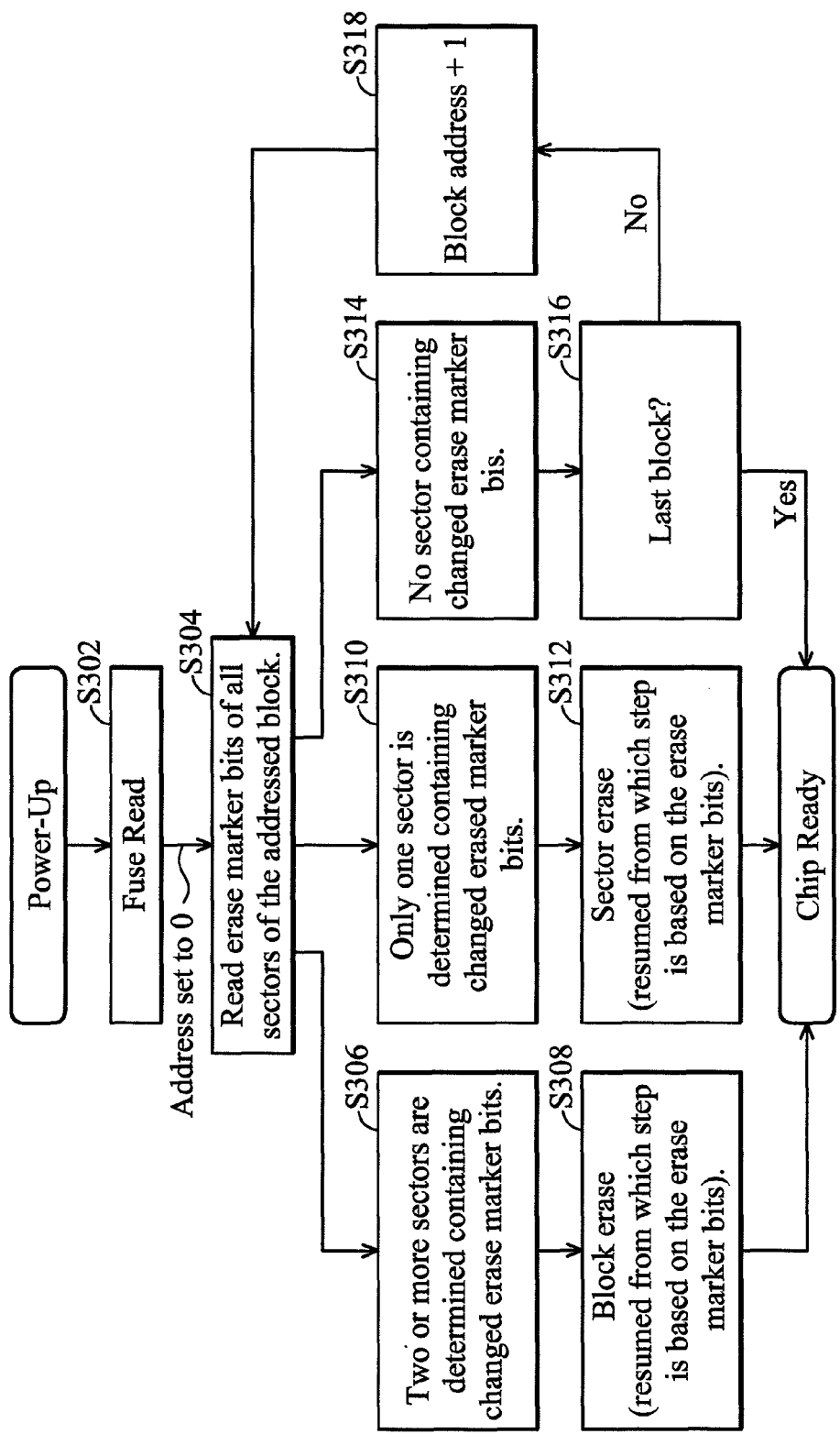
FIG. 3 is a flowchart depicting an erase operation resumption process that the controller 108 executes during a power-up procedure.

FIG. 3 is a flowchart depicting an erase operation resumption process that the controller 108 executes during a power-up procedure. After a fuse read step S302, the controller 108 scans a beginning block (address 0). In step S304, the controller 108 reads out the erase marker bits of the sectors of the beginning block. When it is determined that the erase marker bits of more than one sector of the beginning block has been changed from the default value (condition S306 is established), step S308 is performed. In step S308, a block erase operation is resumed and the resumed block erase operation starts from the interrupted process indicated by the changed value of the erase marker bits. After the resumed block erase operation is completed, the non-volatile memory 106 is ready for other control schemes.

When it is determined that the beginning block has only one sector containing erase marker bits changed from the default value (condition S310 is established), step S312 is performed. In step S312, a sector erase operation is resumed and the resumed sector erase operation starts from the interrupted process indicated by the changed value of the erase marker bits. After the resumed sector erase operation is completed, the non-volatile memory 106 is ready for other control schemes.

When it is determined that the erase marker bits of all sectors of the beginning block are at the default value (condition S314 is established), step S316 is performed. It is determined in step S316, whether all blocks of the non-volatile 106 have been verified. To verify the other blocks of the non-volatile memory 106, step S318 is performed to reassign the address for directing the controller 108 to read a next block, and step S304 is performed again to read the erase marker bits of the sectors of the next block. Then, it is determined which one of the three conditions S306, S310 and S314 has been established and step S308, step S312 or step S316 is performed accordingly. Once it is determined in step S316 that all blocks of the non-volatile memory 106 have been verified, the controller 108 determines that the non-volatile memory 106 is ready for other control schemes.

In another exemplary embodiment, a control method for a non-volatile memory is disclosed. The non-volatile memory has a plurality of blocks for data storage and each block provides a plurality of sectors. The control method comprises the following steps: allocating erase marker bits in each of the sectors; and using the erase marker bits to record the progress of an erase operation performed on the non-volatile memory for resumption of the erase operation when required.

In some exemplary embodiments, the disclosed control method may further change the erase marker bits of one sector when a sector erase operation is performed on the one sector. Or the disclosed control method may further change the erase marker bits of at least two sectors of one block when a block erase operation is performed on the one block. During an erase operation resumption process, the disclosed control method may resume a block erase operation on a block under verification when more than one sector of the block under verification contains changed erase marker bits. When it is determined that the block under verification only has one sector containing changed erase marker bits, a sector erase operation may be resumed on the one sector within the block under verification. During the erase operation resumption process, the blocks of the non-volatile memory may be verified one by one till changed erase marker bits are detected or all blocks of the non-volatile memory are verified. In some exemplary embodiments, several values (referring to the aforementioned five values) are provided to set the erase marker bits to show progress of an erase operation (sector or block erase operation.)

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a non-volatile memory, comprising a plurality of blocks for data storage, wherein each block provides a plurality of sectors; and
a controller, allocating erase marker bits in each of the sectors to record the progress of an erase operation performed on the non-volatile memory for resumption of the erase operation when required,
wherein the erase operation includes a pre-program process, an erase process, a post program process and a refresh process which are differentiated by different values of the erase marker bits.

2. The data storage device as claimed in claim 1, wherein when a sector erase operation is being performed on one sector, the controller changes the erase marker bits of the one sector.

3. The data storage device as claimed in claim 2, wherein when a block erase operation is performed on one block the controller changes the erase marker bits of at least two sectors of the one block.

4. The data storage device as claimed in claim 3, wherein: during an erase operation resumption process, the controller resumes a block erase operation on a block under verification when determining that more than one sector of the block under verification contains changed erase marker bits.

5. The data storage device as claimed in claim 4, wherein when determining that the block under verification only has one sector containing changed erase marker bits the controller resumes a sector erase operation on the one sector within the block under verification.

6. The data storage device as claimed in claim 5, wherein: during the erase operation resumption process, the controller verifies the blocks of the non-volatile memory one by one till changed erase marker bits are detected or all blocks of the non-volatile memory are verified.

7. The data storage device as claimed in claim 5, wherein the controller uses several values to set the erase marker bits and the several values are:
a first value, indicating a pre-program status;
a second value, indicating an erase status;
a third value, indicating a post-program status;
a fourth value, indicating a refresh status; and
a fifth value, a default value for the erase marker bits, indicating an erase-done status.

8. A control method for a non-volatile memory having a plurality of blocks for data storage, wherein each block provides a plurality of sectors, comprising:
allocating erase marker bits in each of the sectors; and
using the erase marker bits to record the progress of an erase operation performed on the non-volatile memory for resumption of the erase operation when required,
wherein the erase operation includes a pre-program process, an erase process, a post program process and a refresh process which are differentiated by different values of the erase marker bits.

9. The control method as claimed in claim 8, further comprising:
changing the erase marker bits of one sector when a sector erase operation is performed on the one sector.

10. The control method as claimed in claim 9, further comprising:
changing the erase marker bits of at least two sectors of one block when a block erase operation is performed on the one block.

11. The control method as claimed in claim 10, further comprising:
during an erase operation resumption process, resuming a block erase operation on a block under verification when more than one sector of the block under verification is determined to contain changed erase marker bits.

12. The control method as claimed in claim 11, wherein:
when it is determined that the block under verification only has one sector containing changed erase marker bits, a sector erase operation is resumed on the one sector within the block under verification.

13. The control method as claimed in claim 12, wherein during the erase operation resumption process the blocks of the non-volatile memory are verified one by one till changed erase marker bits are detected or all blocks of the non-volatile memory are verified.

14. The control method as claimed in claim 12, further comprising:
using several values to set the erase marker bits,
where the several values are:
a first value, indicating a pre-program status;
a second value, indicating an erase status;
a third value, indicating a post-program status;
a fourth value, indicating a refresh status; and
a fifth value, a default value for the marker bits, indicating an erase-done status.

* * * * *